Figure 2:
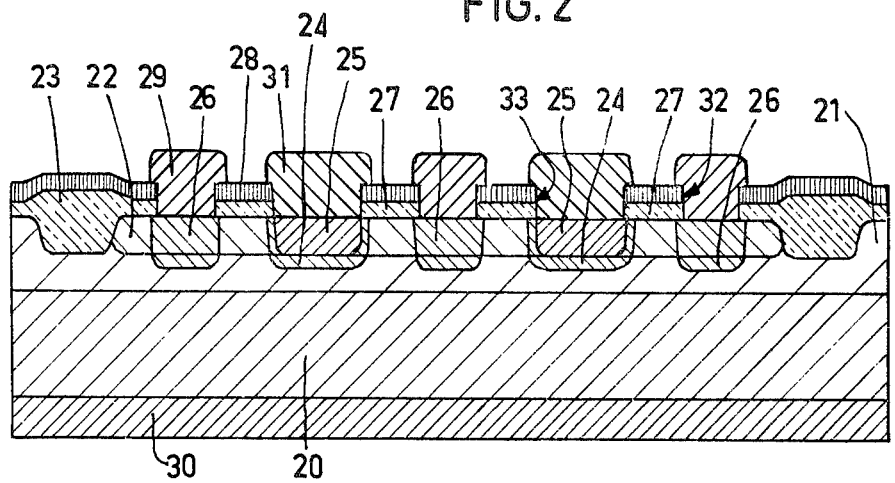

United States Patent [19]

de Brebisson et al.

[11] 4,106,954
[45] Aug. 15, 1978

[54] METHOD OF MANUFACTURING TRANSISTORS BY MEANS OF ION IMPLANTATION

[75] Inventors: Michel de Brebisson, Caen; Maurice Bonis, Herouville, both of France

[73] Assignee: U.S. Philips Corporation, New York, N.Y.

[21] Appl. No.: 767,570

[22] Filed: Feb. 10, 1977

[30] Foreign Application Priority Data

Feb. 20, 1976 [FR] France ................ 76 04758

[51] Int. Cl.$^2$ .................................. H01L 21/265
[52] U.S. Cl. ............................ 148/1.5; 357/34; 357/91
[58] Field of Search ............... 148/1.5; 357/34, 91

[56] References Cited

U.S. PATENT DOCUMENTS

| 3,595,716 | 7/1971 | Kerr et al. ................ 148/187 |
| 3,730,778 | 5/1973 | Shannon et al. ............ 148/1.5 |
| 3,852,119 | 12/1974 | Gosney et al. ............. 148/1.5 |
| 4,025,364 | 5/1977 | Smith ...................... 148/1.5 |

OTHER PUBLICATIONS

R. S. Payne et al., "Fully Ion-Implanted Bipolar Transistors", I.E.E.E. Trans. on Electronic Devices, 21, (1974), 273.
M. K. Barnoski et al., "Microwave . . . of Ion-Implanted Bipolar Transistors", Solid St. Electronics, 16, (1973), 441.
J. A. Archer, "Low-Noise Implanted-Base Microwave Transistors" Solid St. Electronics, 17, (1974), 387.
F. F. Fang et al., "Forming Double Diffused Regions" IBM Tech. Discl. Bull. 14, (1972) 3363.

*Primary Examiner*—R. Dean
*Assistant Examiner*—Upendra Roy
*Attorney, Agent, or Firm*—Frank R. Trifari; Steven R. Biren

[57] ABSTRACT

A method of manufacturing transistors by means of ion implantation is characterized by the implantation of a uniform extrinsic base zone, by providinbg a mask having at least two windows, and by the implantation of the emitter zone and then of the intrinsic active base zone via a first window, after which the implanted zones are annealed.

10 Claims, 23 Drawing Figures

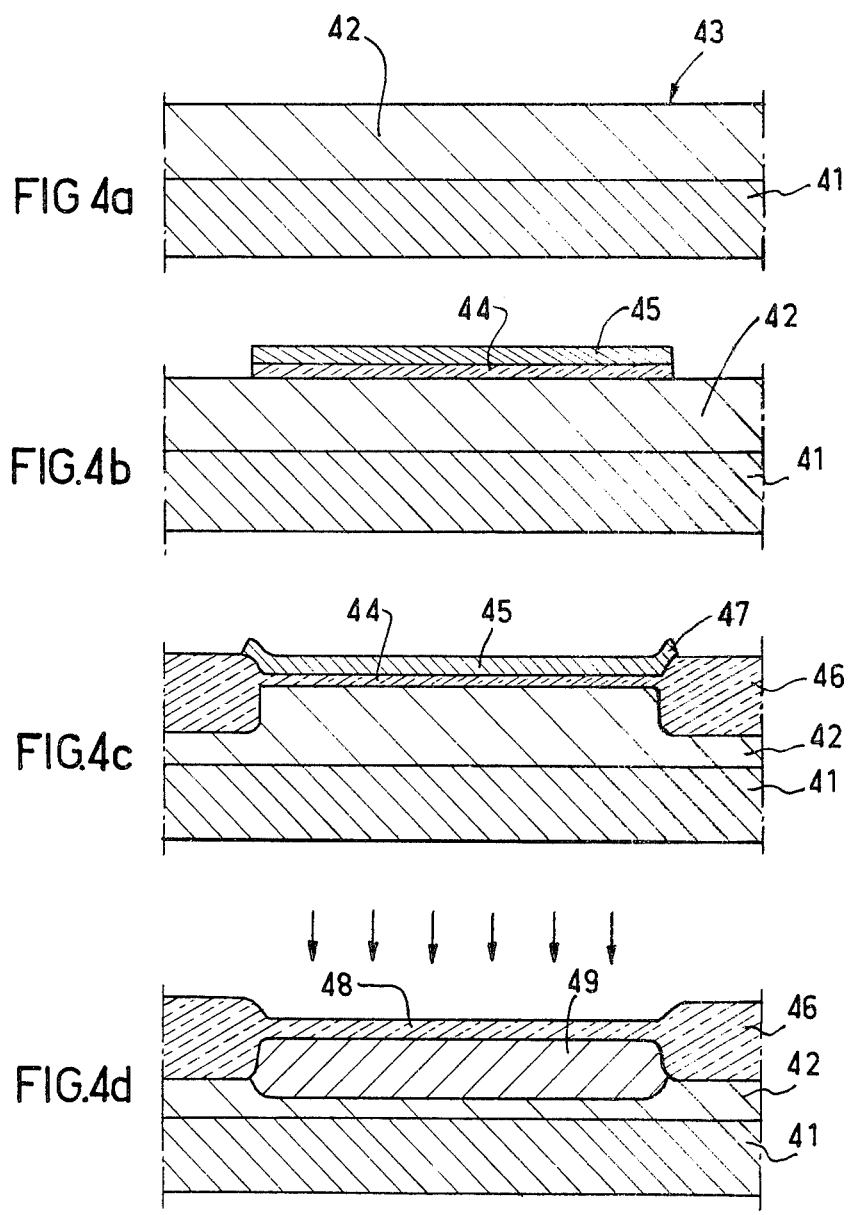

METHOD OF MANUFACTURING TRANSISTORS BY MEANS OF ION IMPLANTATION

The invention relates to a method of manufacturing a semiconductor device having a semiconductor body comprising at least one transistor, in which an emitter zone of a first conductivity type, an underlying intrinsic base zone of the second conductivity type, and an extrinsic base zone of the second conductivity type connected to the intrinsic base zone are provided by ion implantation in a surface-adjoining region of the first conductivity type, the extrinsic base zone being provided with a connection conductor.

The invention also relates to a semiconductor device manufactured by using the method.

In order to improve the performances of semiconductor devices, in particular transistors, both as regards frequency and as regards power, it is advantageous to use techniques and structures which enable on the one hand a decrease of the sizes and in particular a minimum base zone thickness, and on the other hand a maximum ratio between the perimeter of the emitter zone and the surface of the base zone. In this manner very thin flat structures are obtained in which the base zone and the emitter zone preferably interdigitate, which necessitates a very precise mutual positioning of the components during the manufacture of the said structures.

According to a known method of manufacturing transistors, a masking layer is provided on a flat plate, after which an emitter zone is provided via a window in said layer, for example by diffusion, and the base zone is then realized entirely by means of ion implantation through both the emitter zone and the masking layer. This method permits giving the part of the base zone underlying the emitter electrode (termed intrinsic base zone) a very small thickness and also permits on the one hand the self-registering provision of the intrinsic base zone and the emitter zone and on the other hand the correct positioning of the base contact window.

However, the said window has a drawback, namely that it is different to obtain simultaneously an optimum structure of the intrinsic base zone and of the part of the base zone implanted through the masking layer, the extrinsic base zone, which connects the intrinsic active base zone to the base contact. It has proved impossible to obtain simultaneously, via one single implantation, on the one hand an intrinsic base zone whose thickness and doping concentration are optimum and on the other hand an extrinsic base zone whose sheet resistance and thickness are also optimum. Actually, the sheet resistance, the doping profile and the thickness of the zones obtained by implantation depend on the thickness and the properties of the material through which the said implantation is carried out; the thickness and the ion impermeability of the said masking layer which is usually obtained by deposition from the gaseous phase, are not precise and show irregularities which are aggravated by the various photoetching treatments and other treatments which took place prior to the ion implantation. In addition it is possible that the base zone may have an important narrowing along the perimeter of the emitter zone as a result of which the resistance between the intrinsic base zone and the extrinsic base zone can be increased in the case in which the said intrinsic base zone is very thin.

According to other known methods in which the emitter zone is formed in a base zone which was previously formed, it is possible to avoid the said narrowing. However, it is not possible to obtain a very small thickness of the base zone and an accurate positioning of the various parts of the base zone relative to the emitter zone.

It is the object of the invention to avoid the said drawbacks and to enable the manufacture of transistors which are capable of functioning at very high frequencies and supplying large powers.

According to the invention, at least a part of the surface of the region of the first conductivity type is subjected to a bombardment with ions of a dopant determining the second conductivity type so as to form the extrinsic base zone, the implanted surface is covered with a layer masking against ion implantation, a first and a second window are provided in said layer, and ions of a dopant determining the first conductivity type and ions of a dopant determining the second conductivity type are implanted through the first window so as to form the emitter zone and the intrinsic base zone, after which the emitter zone is contacted via the first window and the extrinsic base zone is contacted via the second window.

By forming the base zone of the transistor by means of two ion implantations it is possible on the one hand to realize a uniform extrinsic base zone the sheet resistance of which can show the desired value independently of the intrinsic active base zone, and on the other hand an intrinsic base zone which has the desired thickness. Preferably, the emitter zone is first implanted and then the intrinsic base zone; in this manner the intrinsic base zone can obtain a very small and accurately determined thickness, for the inhibition of the ions by the already implanted emitter zone advantageously influences the situation.

Only a single thermal treatment is carried out and that only at the end of the process, so that the extension caused by lateral diffusion of the emitter zone and the base zone of the transistor is restricted to a minimum. Due to the fact that in addition the intrinsic base zone is implanted in the same window in which the implantation of the emitter zone is carried out, the extension of the said zones takes place during all the treatments carried out after the implantation.

The mask provided on the surface of the plate comprises at least one window which is destined for the base contact zone and which should be closed upon implanting the emitter zone. This is possible without special difficulty, also when the dimensions of the said window and the distances between the windows are very small. The said window may be closed, for example, by means of a photolacquer mask the positioning of which with respect to the provided masking layer does not require great precision; a very accurate alignment is not necessary; the only requirement is that the base contact windows are efficaciously closed.

From the above it follows on the one hand that the method requires only the provision of a single mask in which good precision is indispensible and the base zone, the emitter zone and the contact apertures of the two zones are simultaneously realised, and on the other hand that the said mask is provided at the beginning of the process, namely in a stage in which the surface of the plate is entirely flat due to the fact that the said surface has been subjected to substantially no thermal treatment.

A preferred embodiment of the method is characterized in that the ion implantation to obtain the extrinsic base zone is carried out in a surface part which is bounded by a pattern of electrically insulating material which is sunk in the semiconductor body over a depth which is at least equal to the depth of the extrinsic base zone.

The insulating material is preferably an insulating oxide and, according to a particular embodiment of the method according to the invention, the said oxide is formed in a silicon plate by local thermal oxidation. According to another embodiment of the method according to the invention the zone of insulating material forms a stripe which is obtained by forming a cavity which is then lined with an insulating and passivating material. In both cases the junction obtained by implantation of the base zone does not adjoin the surface of the plate but the said junction is passivated by the insulating material. When the formation of the insulating zone can be carried out at low temperature, the insulating zone may be formed, if desired, after the implantation of the extrinsic base zone.

It is advantageous when the implantation of the extrinsic base zone is carried out through a thin homogeneous oxide layer. It is known that in the implantation through a thin oxide layer the maximum doping concentration is obtained close to the surface of the underlying semiconductor material and in this manner a more favorable doping profile is obtained, in particular for the base contact. The thin oxide layer is preferably obtained by thermal oxidation of the material of the plate, as a result of which a better uniformity and a greater thickness precision are possible as compared with the deposition from the gaseous phase. If necessary, a layer of another material which is permeable to the ions may be provided on the said thin oxide layer. The additional advantage of the thin oxide layer is that the surface of the plate is protected against ambient pollution during the implantations.

When the extrinsic base zone is bounded laterally by an insulating zone which is obtained by local thermal oxidation, a level difference may occur between the surface of the oxide of the insulating zone and the remainder of the plate surface. In this case, the thermal oxidation to form the thin oxide layer may reduce the said level difference and even eliminate it; as a matter of fact, said insulating zone which causes the disturbing thickness difference in itself forms a certain protection against the oxidation resulting in the thin oxide layer.

After the implantation of the extrinsic base zone, the surface layer which comprises most of the implanted impurities may be removed from the said this oxide layer, if desired, and the said thin oxide layer may simultaneously be given its optimum thickness for the further performance of the method. In a further embodiment it is possible to remove the said thin oxide layer entirely and to form a fresh oxide layer with optimum thickness. According to a preferred embodiment of the method according to the invention the emitter zone is implanted down to a depth which is substantially equal to the depth of the already implanted extrinsic base zone. By this embodiment it is possible to control with greater precision the depth of the afterwards-provided active base zone, so that it is possible to realize very small and reproducible base thicknesses.

The extrinsic base zone obtained via the first ion implantation is doped in such manner that a subsequent too strong diffusion is avoided; according to a preferred embodiment, during the implantation of the intrinsic base zone a contact zone of the second conductivity type is also provided, via the second window, on the extrinsic base zone. The implantation of the contact zone causes a high doping of said contact zone so that the quality of the contact provided afterwards on the accessible surface of the said contact zone is improved.

The method according to the invention is particularly suitable for the manufacture of transistors which operate at very high frequencies and which hence require a base zone of minimum thickness and also minimum surface dimensions and in addition must have a maximum perimeter of the emitter zone for handling comparatively high powers. These condition result in a very fine interdigitated structure in which it is necessary to use very accurate masks. The mask used for the method is advantageously realised by forming the windows in the masking layer by plasma etching. Plasma etching achieves better results than etching via a photolacquer mask. Plasma etching enables, for example, the realization of mask apertures the width of which is 1$\mu$, while the distance between the said apertures is less than 2$\mu$.

The various stages of the method described require no high temperature steps. As a result of this, the emitter zone and the various base zone parts obtain the required doping profiles and the ultimate dimensions at the end of only a single thermal treatment at high temperature, namely the annealing treatment after the implantation of the intrinsic base zone.

The method may be used for the manufacture of silicon transistors in which the base zones are obtained, for example, by implantation of boron ions, while the emitter zones are obtained by implantation or arsenic ions.

The method may also be used in manufacturing semiconductor devices which comprise not only transistors but also other active and/or passive components, for example diodes and resistors, in which the assembly thus formed is integrated in a plate of which a surface comprises an active surface part which is subdivided into several islands which are separated from each other by insulation zones.

For example, such a device may comprise at least one resistor the implantation of which is carried out preferably simultaneously with the implantation of the transistor zone. A resistor connected electrically to a base zone of a transistor is formed, for example, by elongating the extrinsic base zone of the transistor, the said elongation being bounded by insulating stripes; other resistance values can be obtained by an implantation which provides the same conductivity type as that of the intrinsic base zone and which is carried out simultaneously with the implantation of said intrinsic base zone. Resistors of the opposite conductivity type can of course also be obtained by an implantation which provides the conductivity type opposite to that of the said base zone and which is carried out simultaneously with the implantation of the emitter zone.

The device may also comprise at least one buried region which is contacted, for example, at the surface.

The metal layers which are usually provided on the flat semiconductor devices to form the required contacts and connections can be realized by known photolithographic and vapor deposition methods. A method is preferably used which is often referred to by the English name of "lift off", in which the metal parts to be removed are eliminated by etching away an auxiliary layer underlying said parts. Such a method which is described, for example, in Applicants' British Patent Specification Nos. 1,435,319 and 1,435,320 is suitable to obtain, for example, very fine interdigitated metallization patterns.

Figure 3:
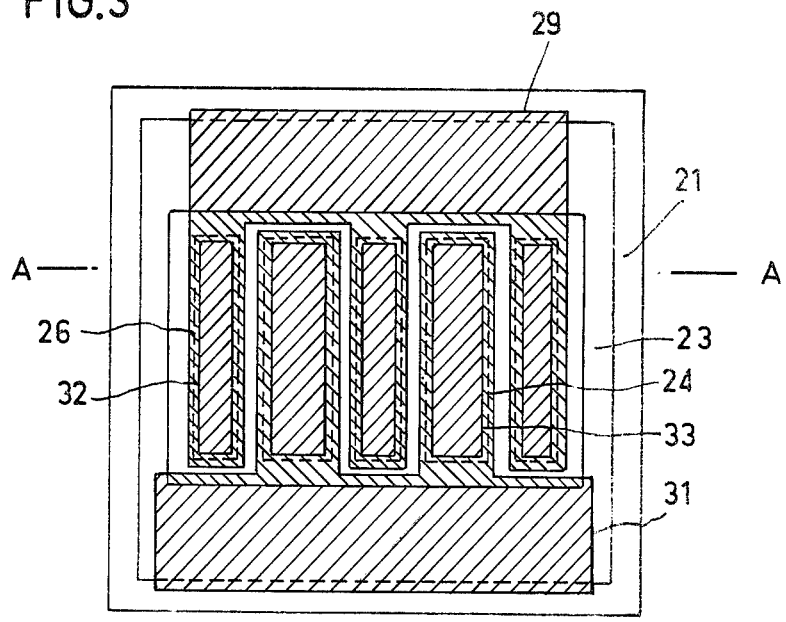

The invention will be described in greater detail with reference to the drawing, in which FIGS. 1a to 1f are diagrammatic sectional views illustrating the principal stages of the manufacture of a transistor by means of the method according to the invention, FIG. 2 is a diagrammatic sectional view taken through the plane AA in FIG. 3 of a transistor for high frequency signals manufactured by means of a method according to the invention, FIG. 3 is a plan view of the transistor shown in FIG. 2, FIGS. 4a to 4k are sectional view illustrating the various stages of a method of manufacturing a transistor of the type described with reference to FIGS. 2 and 3, FIGS. 5a to 5d are sectional views illustrating the various stages of manufacturing another transistor by means of another method according to the invention.

The figures are diagrammatic and the dimensions of the transistors shown are not drawn to scale so as to clarify the figures.

Figure 1A:
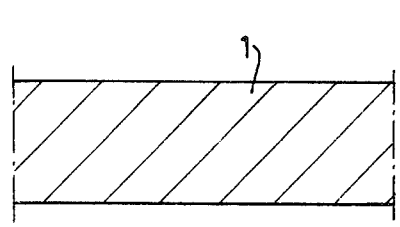
Figure 1D:
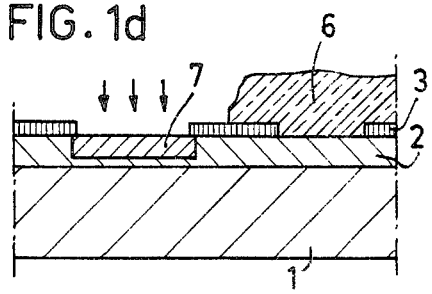
Figure 1B:
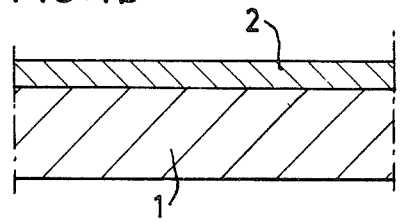
Figure 1E:
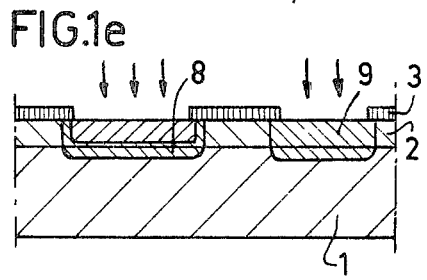
Figure 1C:
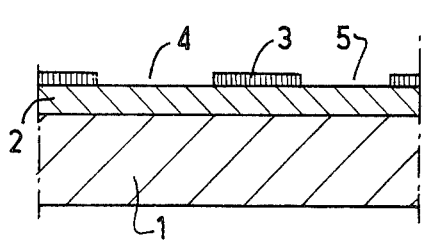
Figure 1F:
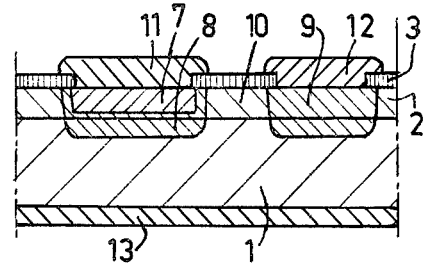

FIGS. 1a to 1f show a part of a plate in successive stages of the manufacture of a transistor by means of the method according to the invention. Starting material is a plate 1 of semiconductor material of a first conductivity type (FIG. 1a). In the first instance a first ion implantation is carried out of doping elements providing the second conductivity type which is opposite to the first conductivity type and which will be the conductivity type of the base zone of the transistor, see FIG. 1b. A masking layer 3 which does not pass the ions to be implanted is provided at least on the surface of the implanted zone 2 (FIG. 1c). Windows 4 and 5 are provided in said layer 3. The window 4 is destined for the base zone and the emitter zone, and the window 5 is destined for the base contact zone.

By means of a mask 6 (FIG. 1d) of a material which also does not passions to be implanted which are to form the emitter zone, the window 5 of the mask 3 is closed without closing the window 4, while ions which provide the first conductivity type are implanted in the zone 2 via the window 4. The implantation is carried out with an ion dose which causes a high doping concentration in the implanted zone 7 which is to form the emitter zone of the transistor.

The mask 6 is removed in such manner that the windows 4 and 5 remain open while afterwards, via said windows 4 and 5 (FIG. 1e), an ion implantation is carried out which provides the second conductivity type. Said implantation is carried out with an ion dose which gives the implanted zones 8 and 9 thus formed the suitable doping concentration and gives said zones 8, 9 a depth which exceeds the depth of the zone 7. The zone 9 forms a base contact zone, while the part of the zone 8 outside the zone 7 forms the intrinsic base zone of the transistor, the remainder 10 of the zone 2 forming a part of the extrinsic base zone of the transistor.

The manufacture of the transistor is terminated by a thermal treatment, namely the annealing of the implanted zones and by the provision of metal contact layers (FIG. 1f): a metal layer 12 forms the base contact and a metal layer 11 forms the emitter contact. A metal layer 13 on the opposite surface of the plate forms the collector contact.

The extrinsic base zone 10 and the intrinsic base zone 8 or active base zone are hence obtained via two different implantations so that it is possible to optimize the characteristics of the said zone independently of each other.

The implantation of the intrinsic base zone 8 is carried out via the emitter zone, as a result of which it is possible in most of the cases to obtain a base zone whose thickness may be particularly small. There is no risk of a narrowing of the base zone in the connection zone between the intrinsic base zone and the extrinsic base zone, for the intrinsic base zone and the emitter zone were implanted via the same window and afterwards diffuse simultaneously.

This latter advantage is also obtained when the succession of the implantations to obtain the emitter zone and the base zone is inverted.

It is to be noted that the mask 6 does not require the same position as the mask 3 since the edge of said mask may be at any place between the windows 4 and 5. The mask 3 only requires a great precision when the dimensions of the zones are minimum, in particular in the case of a fine interdigitated structure. The mask 3 determines at the same time the positions of the base zone, the emitter zone and of the base and emitter contact apertures and is formed at the beginning of the process, so prior to any thermal treatment which might give rise to deformation of the plate and degradation of the plate and degradation of the surface thereof.

FIG. 2 is a diagrammatic sectional view and FIG. 3 is a plan view of a transistor which can be obtained by means of the method according to the invention. Said transistor has an interdigitated flat structure and is laterally insulated by an oxide, said insulation serving in particular to passivate the base-collector junction. The said transistor comprises an $n^+$ substrate 20 and an n-type epitaxial layer 21 which forms the collector zone. The base zone comprises an extrinsic base zone 22 extending uniformly at the surface of the layer 21 and being bounded by an insulating oxide stripe 23, an intrinsic base zone 24 situated below an emitter zone 25 whose depth is approximately equal to the thickness of the extrinsic base zone 22, and base contact zones 26 reaching the same depth as the intrinsic base zone 24. The contact zones of the base zone, the emitter zone and the intrinsic base zone have an interdigitated structure. Totally five zones are shown but, of course, it is possible for the number of zones to be much higher in accordance with the geometry of the transistor. Outside the insulating zones or stripes 23 the surface of the plate is passivated by a thin layer 27 formed by the same insulating oxide, while the whole oxide layer which covers the plate supports a layer of a material which is impervious to the ions which are used for implanting the base zone and the emitter zone.

The various contacts are formed by the following metal layers: the collector contact is formed by a layer 30 which is provided on the substrate surface opposite to the implantation surface; the base contact is formed by a metal layer 29 which realizes the contact via the corresponding contact aperture 32, while finally the emitter contact is formed by a metal layer 31 which realizes the contact via the corresponding contact aperture 33.

The method according to the invention results in a uniform extrinsic base zone 22 for sheet resistance of which is optimum, an intrinsic base zone 24 the thickness and doping concentration of which are optimum, a strongly doped base contact zone 26, while providing the intrinsic active base zone, the emitter zone and the contact window in a self-registering manner, while also a fine interdigitated structure is obtained the elements of which are situated close together.

The manufacture of a transistor of the type described above is carried out, for example, as follows when it relates to a silicon transistor of the npn-type which is to operate at a very high frequency: starting material is a plate 41 of silicon having n+ conductivity type and a doping concentration of $5.10^{18}$ atoms/cm$^3$; an epitaxial n-type silicon layer 42 is provided which is doped with phosphorus and has a resistivity of approximately 1 Ohm.cm (FIG. 4a).

On the surface 43 of the layer 42 is formed, for example by thermal oxidation, a layer 44 of silicon oxide (SiO$_2$) (FIG. 4b) the thickness of which is approximately 500 Ångstrom; a layer 45 of silicon nitride (Si$_3$N$_4$) is provided on the said layer 44 in a thickness of approximately 1000 Angstrom to protect the underlying silicon against oxidation. The layers 44 and 45 are then subjected to a photoetching process in which only the part which corresponds to the overall surface which is desired for the base zone of the transistor remains.

The next step is a deep thermal oxidation, according to a known method, of the surface part which is not protected by the layer 45 remaining after the photoetching treatment. Upon heating to 1100° C for approximately 1 hour in an atmosphere of moist oxygen, an insulating stripe 46 (FIG. 4c) is obtained in this manner whose thickness is approximately 0.5 micron and which bounds a given part of the silicon plate. It is to be noted that the said stripe 46 adjoins the layer part 44 which remains below the layer 45 and that the said stripe 46 causes a deformation of the edge of the layer 45, as indicated at 47.

The remainder of the layer 45 is etched away selectively, for example, by means of orthophosphoric acid, after which the thickness of the layer 44 is given its optimum value with respect to the implantation of the extrinsic base zone in which the said optimum value is approximately 0.15 micron, and is obtained by oxidation of the underlying silicon. The required thickness of 1000 Ångstrom is added, for example, by thermal oxidation of 1000° C for 20 minutes. The thickness of the resulting oxide layer 48 which covers the silicon is determined so as to situate the maximum doping concentration of the implanted ions as close as possible to the silicon surface and to obtain a doping profile which is as advantageous as possible.

The next step is the implantation of the extrinsic base zone. For that purpose, boron ions with an energy of 30 to 50 KeV are implanted at 49 (FIG. 4d); the ions implanted in this manner give rise to a doping concentration of $10^{17}$ to $10^{18}$ boron atoms/cm$^3$ and reach a depth of 0.3 micron in the silicon, the maximum concentration in the silicon being near the interface silicon-oxide.

A surface layer of the thin oxide layer 48 is then removed. This is carried out by means of diluted hydrofluoric acid over a thickness of approximately 800 Ångstrom. In this manner at least the most polluted part of the layer 48 is eliminated.

A layer 51 of silicon nitride is then provided on the whole surface of the plate (FIG. 4e), for example by means of silane and ammonia. The thickness of the layer 51 is 1000 Angstrom so that the said layer 51 becomes impervious to the ions which will be implanted to form the emitter zone and the intrinsic base zone.

The next step is etching in a freon plasma to form an implantation mask for the emitter zone and the intrinsic base zone, the said plasma etching process simultaneously realizing the required contact apertures for the base and emitter zone. For this purpose, a layer of photosensitive material is provided on the plate and a mask is formed in said layer via a photolithographic etching process; the uncovered parts of the silicon nitride layer 51 are etched via the windows of said mask and then those of the underlying oxide layer 48.

In this manner windows 52, 53, 54 are formed in the layers 51 and 48 which form the mask for the implantation of the emitter zone, the intrinsic base zone and the base contact zone, the said windows simultaneously forming the contact apertures for the base and emitter zone. The window 52 is, for example, the contact aperture for the emitter zone, while the windows 53 and 54 are the contact apertures for the base zone.

Prior to the implantation of the emitter zone it is necessary to close the windows in the mask 51-48, with the exception of the window for the emitter zone. For that purpose, a layer 55 of photosensitive lacquer (FIG. 4f) is provided on the surface of the plate, while an aperture is provided photolithographically in the said layer 55, which aperture is sufficiently large to expose the window of the emitter zone 52. The photomask thus obtained should be impervious to the ions used for the implantation of the emitter zone and is not critical.

The implantation of the emitter zone is then carried out, namely an implantation of ions providing the n+ conductivity type, for example, arsenic ions with an energy of 80 to 140 KeV, while the implantation doses are $5.10^{14}$ to $5.10^{15}$ arsenic atoms per cm$^2$, preferably $2.10^{15}$ atoms per cm$^2$. The depth of the implanted zone 56 is approximately equal to that of the already implanted extrinsic base zone, that is 0.2 micron or slightly less.

The next step is the chemical removal of the photolacquer layer 55 in a nitric acid bath but preferably in a plasma of gas comprising fluorine.

Figure 4I:
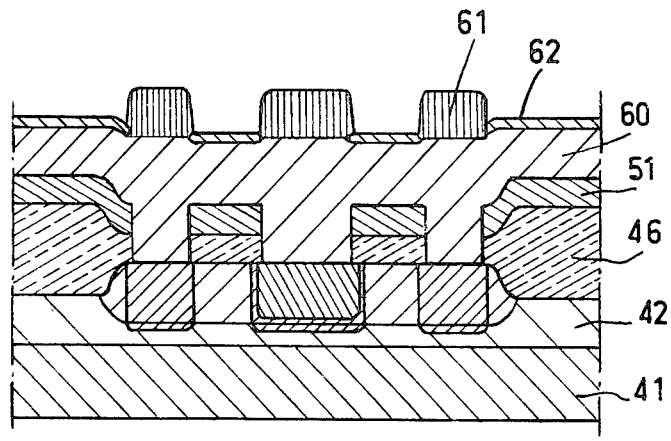
Figure 4J:
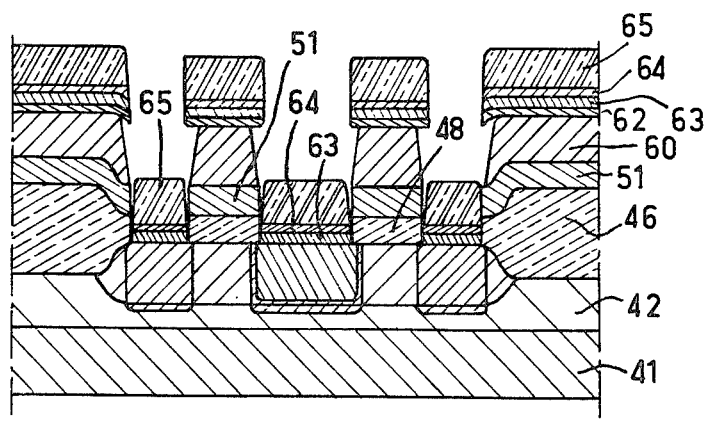
Figure 4K:
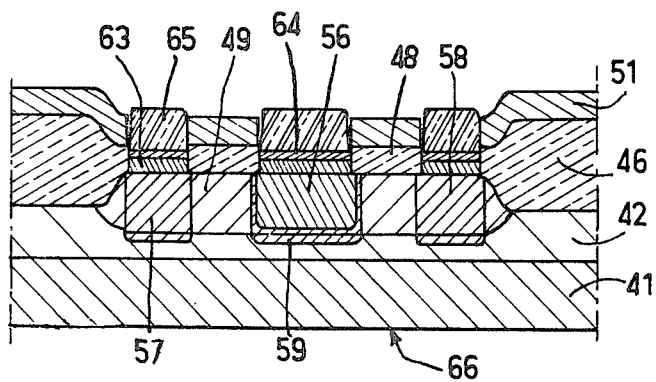
Figure 4E:
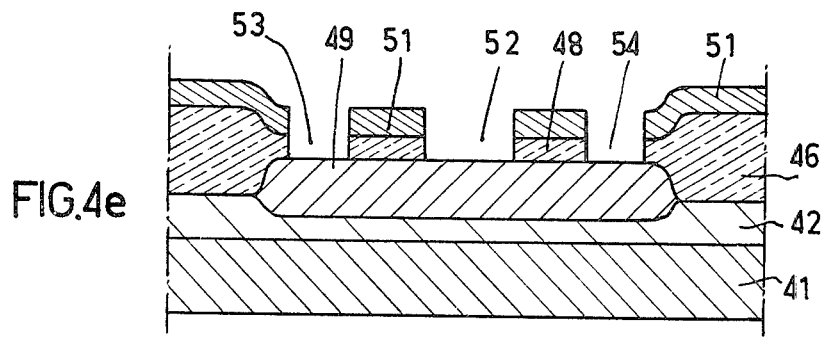
Figure 4F:
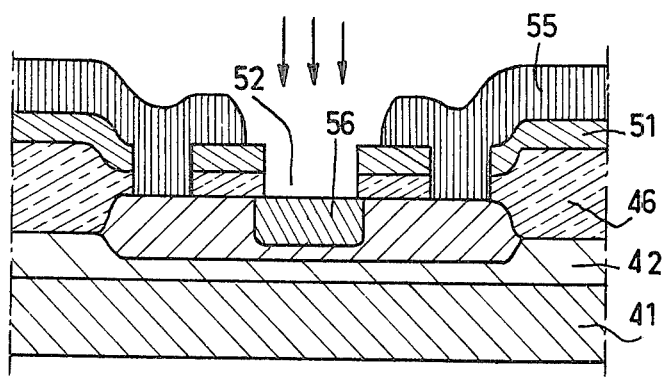
Figure 4G:
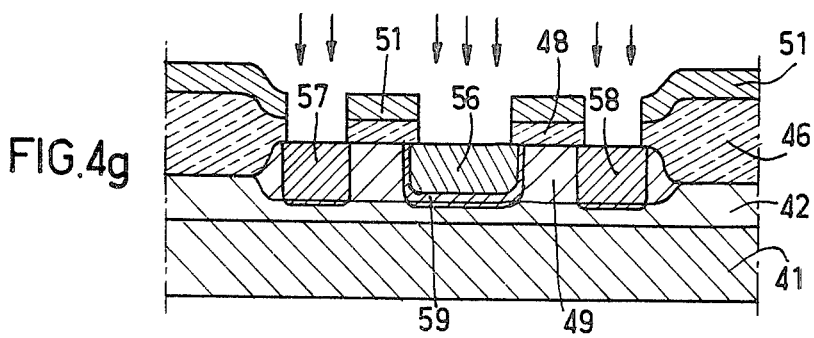

The implantation of the intrinsic active base zone and of the base contact zone may then be carried out. Said implantation in the windows 52, 53, 54 of the mask 51-48 is carried out with boron ions with an energy of 30 to 40 KeV, the implantation dose being $5.10^{13}$ to $5.10^{14}$ boron atoms/cm$^2$ (FIG. 4g). In this manner the zones 57, 58, 59 are obtained with a depth which is larger than that of the emitter zone, for example 0.3 micron.

Figure 4H:
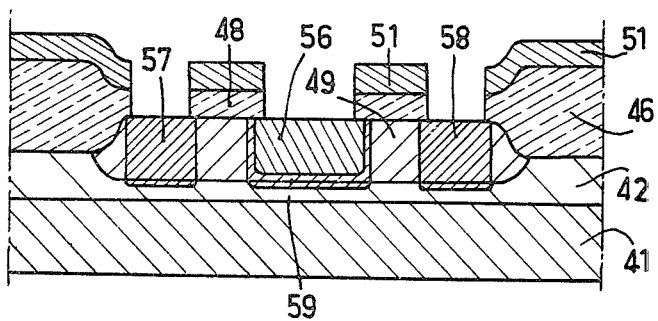

The next step is an annealing treatment to eliminate crystal defects. The said annealing treatment is carried out at 1000° C for 10 to 5 minutes in a nitrogen atmosphere and in such manner that no oxide is formed in the windows destined for the contacts. The conditions in which the annealing treatment is carried out cause substantially no variation of the depth of the implanted zones (FIG. 4h).

In this stage it is advantageous, after cleaning the silicon surfaces by means of dilute hydrofluoric acid, to vapour-deposit a platinum layer succeeded by an annealing treatment so as to form a thin platinum silicide layer to improve the quality of the contact on the base zone. The platinum remaining on the surface is removed; an aluminium layer 60 is then provided on the surface of the plate by evaporating aluminium in a vacuum, the thickness of the said aluminium layer being approximately 0.7 micron (FIG. 4i). A photolacquer mask 61 is then provided which covers the aluminium surfaces corresponding to the contact layers and to the interconnections, if any, and which otherwise leaves the surface of the layer 60 exposed so that it is possible to perform afterwards an anode oxidation on the remainder of the surface so as to form in this manner a dense layer 62 of aluminium oxide.

The photolacquer mask 61 is then removed by means of nitric acid; the aluminium layer 60 is then etched via the windows formed in the dense aluminium oxide layer 62 by removing the said mask 61 (FIG. 4i). The etching of the aluminium is carried out, for example, in a bath on the basis of orthophosphoric acid. After the local etching of the aluminium the surface of the plate shows two different surface levels, the difference between said two levels being sufficient to break the metal layers, which were provided on the said plate by evaporation in a vacuum, at the boundary lines between both levels. According to a known method of manufacturing contacts, a first metal layer 63 of titanium, a second metal layer 64 of platinum, and a third metal layer 65 of gold are provided.

The underetching of the layer 60 in particular and the overall thickness of the assembly formed by the local layers 48, 51, 60 and 62 result in a certain discontinuity of the metal layers.

The next step is the removal, by means of a suitable chemical method, of the aluminium layer 60 which effectively is accessible for the etching solution along the discontinuity of the metal layers. By the removal of the layer 60, the metal layer parts covering the said layer 60 are also removed (FIG. 4k) and only the configuration of titanium, platinumm and gold remains which is necessary for the base and emitter contacts.

The collector contact requires the provision of a metal layer on the opposite surface 66 of the substrate.

According to a modified embodiment of the method according to the invention the manufacture of a transistor is carried out as follows. Starting material is a plate 71 (FIG. 5a) of semiconductor material of the first conductivity type which is covered by a weakly doped epitaxial layer 72 of the same conductivity type; a surface layer 73 of the opposite conductivity type which is to form the extrinsic base zone of the transistor is implanted in the said epitaxial layer 72. A thin layer 74 (FIG. 5b) which is inert with respect to the etchants of the material of the layer 73, is provided on the implanted surface 79, while in said thin layer 74 a window 75 is provided to obtain a stripe-like zone which laterally insulates the transistor. A groove 70 is etched through the window 75 which bounds and insulates a region 79' which forms part of the layer 73 and which forms the extrinsic base zone of the transistor.

Through the same window 75 the groove 70 is then lined with an insulating and passivating material 76 by means of a method which does not require a long-lasting operation at high temperature. The groove 70 may be filled entirely, while another possibility is to cover only the walls thereof.

Figure 5A:
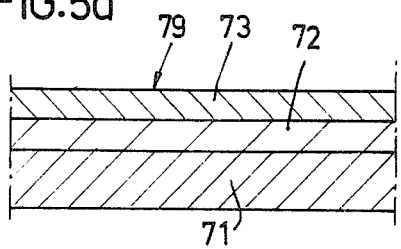
Figure 5C:
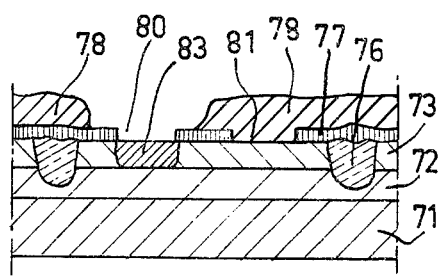
Figure 5B:
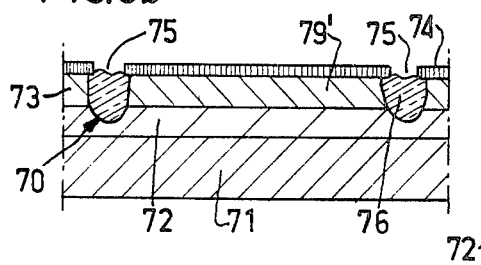

A fresh mask is then manufactured either by providing new windows in the thin layer 74, or, after removing the said layer 74, by providing a fresh thin layer 77 in which a window 80 is provided to form the emitter zone and the intrinsic base zone, and also a window 81 to manufacture a base contact (FIG. 5c). By means of a local layer 78 of a material which does not pass the ions to be used for forming the base zone and emitter zone, the window 81 is then closed and in said window 80 a local ion implantation is carried out to form a highly doped zone 83 of the first conductivity type, which zone 83 is to form the emitter zone.

Figure 5D:
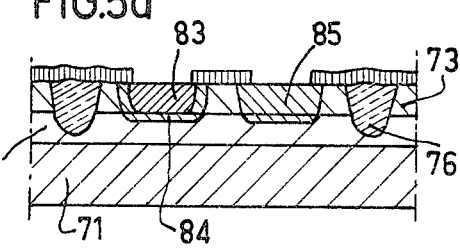

The layer 78 is then removed and a local ion implantation is carried out in the windows 80 and 81 by means of ions which provide the conductivity type of the base zone so as to form in this manner, via the emitter zone, an implanted zone 84 which forms the intrinsic base zone and on the other hand, via the window 81, to form an implanted base contact zone 85 (FIG. 5d). The implanted zones are then annealed so as to eliminate the crystal defects, while finally electrodes are provided on the surface 79 as far as the base zone and the emitter zone are concerned and on the oppositely located surface as far as the collector zone is concerned.

What is claimed is:

1. A method of manufacturing a semiconductor device having a semiconductor body comprising at least one transistor in which an emitter zone of a first conductivity type, an underlying intrinsic base zone of a second conductivity type, and an extrinsic base zone of the second conductivity type connected to the intrinsic base zone are provided by ion implantation in a surface-adjoining region of the first conductivity type in said semiconductor body, the extrinsic base zone being provided with a connection conductor, comprising the steps of subjecting at least a part of the surface of the surface-adjoining region of the first conductivity type to a bombardment with ions of a dopant determining the second conductivity type so as to form the extrinsic base zone, covering the implanted surface with a layer masking against ion implantation, providing a first and a second window in said layer, implanting ions of a dopant determining the first conductivity type and ions of a dopant determining the second conductivity type through the first window so as to form the emitter zone and the intrinsic base zone, said ions forming the intrinsic base zone being implanted to a depth sufficient to convert a portion of said surface-adjoining region of the first conductivity type to the second conductivity type of said intrinsic base zone, contacting the emitter zone via the first window and contacting the extrinsic base zone via the second window.

2. A method as claimed in claim 1, wherein first the emitter zone is implanted and then the intrinsic base zone is implanted.

3. A method as claimed in claim 1 wherein the ion implantation to obtain the extrinsic base zone is carried out in a surface part which is bounded by a pattern of electrically insulating material which is sunk in the semiconductor body over a depth which is at least equal to the depth of the extrinsic base zone.

4. A method as claimed in claim 1, wherein the implantation of the extrinsic base zone is carried out through a thin homogeneous oxide layer.

5. A method as claimed in claim 1, wherein the emitter zone is implanted down to a depth which is substantially equal to that of the extrinsic base zone.

6. A method as claimed in claim 1, wherein during the implantation of the intrinsic base zone a contact zone of the second conductivity type is also provided on the extrinsic base zone via the second window.

7. A method as claimed in claim 1, wherein the windows in the masking layer are formed by plasma etching.

8. A method as claimed in claim 1, wherein during the implantation of the emitter zone the other windows present are temporarily closed by a material masking against the implantation.

9. A method as claimed in claim 4, wherein after the implantation of the extrinsic base zone at least a surface layer of the thin oxide layer is removed.

10. A method as claimed in claim 4, wherein the starting material is an n-type silicon body, the extrinsic base zone is obtained by implantation of boron ions with an energy between 30 KeV and 50 KeV through the silicon oxide layer, the emitter zone is obtained by implantation of arsenic ions with an energy between 80 KeV and 140 KeV and a dose between $5.10^{14}$ and $5.10^{15}$ atoms per $cm^2$, and the intrinsic base zone is obtained by implantation of boron ions with an energy between 30 KeV and 40 KeV and a dose between $5.10^{13}$ and $5.10^{14}$ atoms per $cm^2$.

* * * * *

UNITED STATES PATENT AND TRADEMARK OFFICE
CERTIFICATE OF CORRECTION

PATENT NO. : 4,106,954
DATED : August 15, 1978
INVENTOR(S) : MICHEL DE BREBISSON ET AL It is certified that error appears in the above-identified patent and that said Letters Patent are hereby corrected as shown below:

On the Title Page, Section [57], line 3, "providinbg" should be --providing--

Claim 3, line 1, "1" should be --1,--

Signed and Sealed this

First Day of May 1979

[SEAL]

Attest:

RUTH C. MASON
Attesting Officer

DONALD W. BANNER
Commissioner of Patents and Trademarks